(12) United States Patent
Marshall et al.

(10) Patent No.: US 7,888,192 B2
(45) Date of Patent: Feb. 15, 2011

(54) PROCESS FOR FORMING INTEGRATED CIRCUITS WITH BOTH SPLIT GATE AND COMMON GATE FINFET TRANSISTORS

(75) Inventors: Andrew Marshall, Dallas, TX (US); Theodore Warren Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 239 days.

(21) Appl. No.: 12/268,416

(22) Filed: Nov. 10, 2008

(65) Prior Publication Data

US 2010/0118599 A1    May 13, 2010

(51) Int. Cl.
*H01L 21/8234*    (2006.01)
(52) U.S. Cl. ............... 438/157; 438/197; 257/E21.7
(58) Field of Classification Search ............. 438/157, 438/197; 257/E21.7, E21.616, E27.099
See application file for complete search history.

(56) References Cited

U.S. PATENT DOCUMENTS

| | | | |
|---|---|---|---|
| 5,629,224 A | 5/1997 | Rostoker et al. | |
| 6,943,405 B2 | 9/2005 | Bryant et al. | |
| 7,348,641 B2 | 3/2008 | Zhu et al. | |
| 2007/0257319 A1 | 11/2007 | Xiong et al. | |
| 2007/0259501 A1 | 11/2007 | Xiong et al. | |
| 2008/0099795 A1* | 5/2008 | Bernstein et al. | ............ 257/255 |

* cited by examiner

*Primary Examiner*—Thao P. Le
(74) *Attorney, Agent, or Firm*—Warren L. Franz; Wade J. Brady, III; Frederick J. Telecky, Jr.

(57) ABSTRACT

A method is disclosed for forming an integrated circuit including a common gate FinFET device and a split gate FinFET device. Taller fins and shorter fins of different heights are formed in a semiconductor surface. Layers of gate dielectric material and gate electrode material are formed over tops and sides of the fins. The gate electrode material layer is planarized using chemical-mechanical polishing to remove the gate electrode material from the tops of the taller fins, leaving the gate electrode material over the tops of the shorter fins. The planarized material is patterned to form split (dual) gate structures on the sides of the taller fins and common gate structures on the tops and sides of the shorter fins.

18 Claims, 6 Drawing Sheets

US 7,888,192 B2

PROCESS FOR FORMING INTEGRATED CIRCUITS WITH BOTH SPLIT GATE AND COMMON GATE FINFET TRANSISTORS

FIELD OF THE INVENTION

Embodiments of the present invention generally relate to MOSFET transistors and more particularly to the fin-type MOSFET transistors commonly known as FinFETs, and to methods for forming integrated circuits (ICs) including at least one fin which provides a split gate FinFET and at least one fin which provides a conventional common gate FinFET.

BACKGROUND

Field effect transistors (FETs) can be formed in a variety of ways to serve a variety of purposes for integrated circuits and other devices. Commonly, FETs are formed as "planar" devices in many integrated circuits, i.e., as devices in which the conduction channel has width and length extending in a direction parallel to the major surface of a substrate. FETs can be formed in a semiconductor-on-insulator (SOI) layer of a substrate or in a bulk semiconductor substrate.

Frequently, FETs are formed having a non-planar conduction channel, in order to serve a special purpose. In such non-planar FETs, either the length or the width of the transistor channel is oriented in the vertical direction, that is, in a direction perpendicular to the major surface of the substrate. In one such type of device, commonly referred to as the FinFET, the width of the conduction channel is oriented in the vertical direction, while the length of the channel is oriented parallel to the major surface of the substrate. With such orientation of the channel, FinFETs can be constructed to have a larger width conduction channel than planar FETs so as to produce larger current drive than planar FETs which occupy the same amount of integrated circuit area (the area parallel to the major surface of the substrate).

As known in the art, improved circuit performance or function can often be provided by providing extra transistors. For example, in SRAM cell designs, there are known benefits to having dual pass gate devices, such as to optimize read and write configurations, and for compensating for process corners. However, as well known in the art, the cost for ICs is generally based on their die area. Accordingly, adding extra transistors to a conventional IC design adds to the cost of the circuit. Hence, it is desirable to be able to add transistors to an IC design without adding any significant additional die area and thus additional die cost.

SUMMARY

This Summary is provided to comply with 37 C.F.R. §1.73, presenting a summary of the invention briefly indicating the nature and substance of the invention. It is submitted with the understanding that it will not be used to interpret or limit the scope or meaning of the claims.

A method is disclosed to fabricate an integrated circuit (IC) that includes a plurality of MOSFETs including at least one common gate FinFET device and at least one split gate FinFET device. A substrate having a semiconductor surface is provided. A plurality of semiconductor fins are formed from the semiconductor surface, including at least one taller fin of a first height and at least one shorter fin of a second height, wherein the first height is greater than the second height. Gate stacks are formed on the taller and shorter fins such that a gate electrode for the taller fin is a split gate electrode and a gate electrode for the shorter fin is a common gate electrode. Fabrication of the IC is completed, wherein the split gate FinFET includes the split gate electrode and the common gate FinFET device includes the common gate electrode.

The gate electrode can comprise polysilicon. Selective fin etching can be used to reduce the height of a portion of the fins to form one or more shorter fins. A planarization process, such as, but not limited to, chemical-mechanical polishing (CMP) and its variants, can be used to form a gate electrode for the taller fin that is a split gate electrode and a gate electrode for the shorter fin that is a common gate electrode.

As noted above, in SRAM cell designs, there are benefits to having dual (split) pass gate devices, such as for example to optimize read and write operations, and to compensate for process corners. This is typically not an option in substrates comprising conventional bulk silicon due to the accompanying increase in die area and resulting increase in die cost. However, in certain embodiments of the invention FinFETs are used, where the new split gate FinFET architecture provides parallel transistors formed from the same fin, using the same or nearly the same die area used by a conventional FinFET. The actual area needed depends on the configuration. Since contacts need a certain amount of space, generally in current designs being positioned on a flat surface, a bit more area may be added due to the contact for the second gate. However, sidewall contacts can allow the split gate FinFET architecture to use the same area used by a conventional common gate FinFET.

A variety of ICs can benefit from the area efficient combination of at least one split gate FinFET and at least one common gate FinFET device. In one IC embodiment that includes one or more SRAM arrays, the SRAM array uses a combination of at least one split gate FinFET and at least one common gate FinFET device. Applied to SRAMs, use of a split gate FinFET with a separate Word line coupled to a separate respective one of each of its dual (split) gates can provide variable read and write currents to SRAM cells without an increase in cell size. Combining conventional common gate and split gate FinFETs according to embodiments of the invention on the same IC can be applied in other than SRAMs. For example, the extra gate provided by the split gate FinFET can be used for back gate biasing the other transistor provided by the split gate FinFET, such as for reducing the input offset voltage (VIO) for a differential amplifier, or be used in other circuitry that can benefit from the addition of back-gate biasing.

DETAILED DESCRIPTION OF EXAMPLE EMBODIMENTS

Figure 1A:
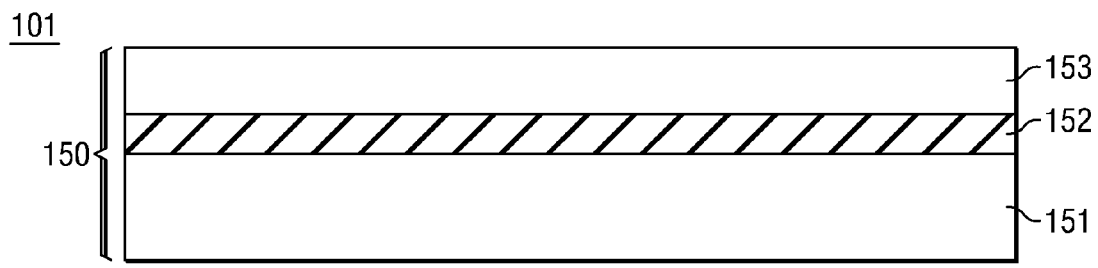
FIGS. 1A-H are cross-sectional (FIGS. 1A-G) and top (FIG. 1H) depictions associated with a method for fabricating an integrated circuit (IC) comprising a plurality of MOSFETs including at least one common gate FinFET device and at least one split gate FinFET device, according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIGS. 1A-H show steps associated with a method 100 for fabricating an integrated circuit (IC) comprising a plurality of MOSFETs including at least one conventional common gate FinFET device and at least one split gate FinFET device, according to an embodiment of the invention. FIG. 1A shows the resulting cross section after step 101 which comprises providing a substrate 150 having a semiconductor surface 153. Substrate 150 can be a substrate comprising bulk silicon or a semiconductor on insulator (SOI) substrate. In the case of a substrate 150 comprising bulk silicon, trench isolation (not shown) will generally be provided.

Substrate 150 in FIG. 1A is shown as an SOI substrate comprising a silicon surface 153 on a dielectric layer 152. A conventional SOI substrate comprises a relatively thick semiconductor support layer 151 (e.g., 200 to 600 μm thick) having a dielectric layer 152 thereon, and a thin semiconductor surface layer 153 (e.g., silicon) on the dielectric layer 152 upon which one or more transistors are formed per active region. The surface semiconductor layer for a SOI substrate is generally 30 to 400 nm thick. The dielectric layer 152 can comprise a silicon oxide, such as silicon dioxide.

Figure 1B:
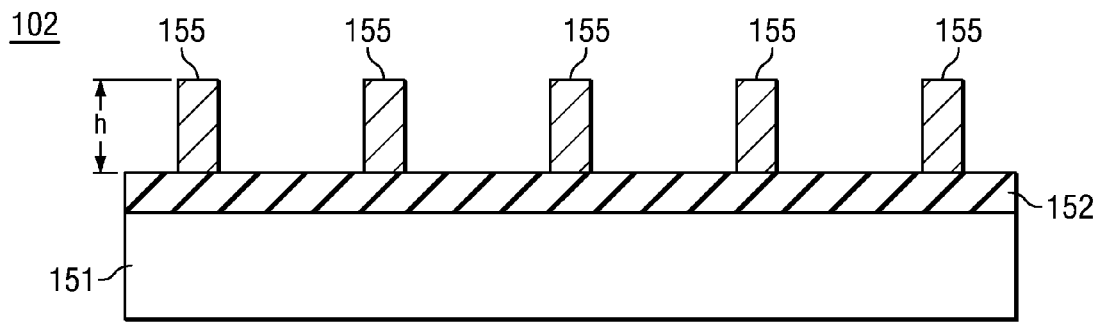
Figure 1C:
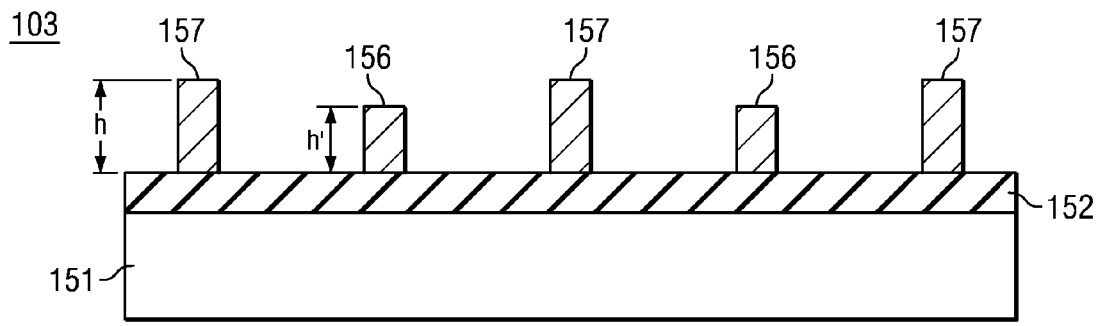

FIG. 1B shows the resulting cross section after step 102 which comprises forming a plurality of semiconductor fins from the semiconductor surface 153. The height of the fins is shown as "h". FIG. 1C shows the resulting cross section after step 103 which comprises providing at least one taller fin 157 and at least one shorter fin 156.

In one embodiment, the step 103 can comprise selective etching, wherein the selective etching can comprise masking the fin(s) that will be the at least one taller fin 157 (having a first height shown as "h") with a masking material, and etching other fin(s) to form the at least one shorter fin 156 having a second height shown as "h". The masking material can comprises a hard mask layer such as SiN, SiON, or SiC, or a photoresist layer. In the illustrated selective etching embodiment, the first height shown in FIG. 1C as "h" corresponds to the thickness of surface semiconducting layer 153. However, in other embodiments of the invention, "h" does not correspond to the thickness of surface semiconducting layer 153.

The first height "h" is at least 10% greater than the second height "h", such as 20% greater, 30% greater, 40% greater or 50% greater. In one exemplary embodiment, the first height h=90 to 100 nm and the second height h'=40 to 60 nm.

Figure 1D:
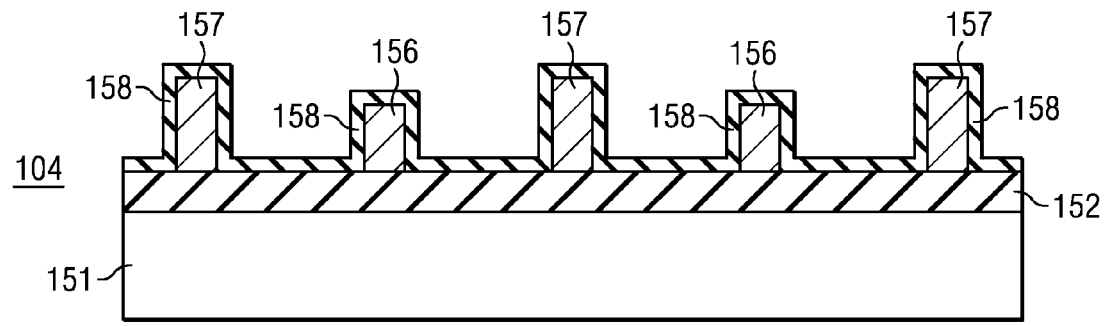

FIG. 1D shows the resulting cross section after step 104 which can comprise forming a gate dielectric layer 158 on both the taller fins 157 and the shorter fins 156.

Figure 1E:
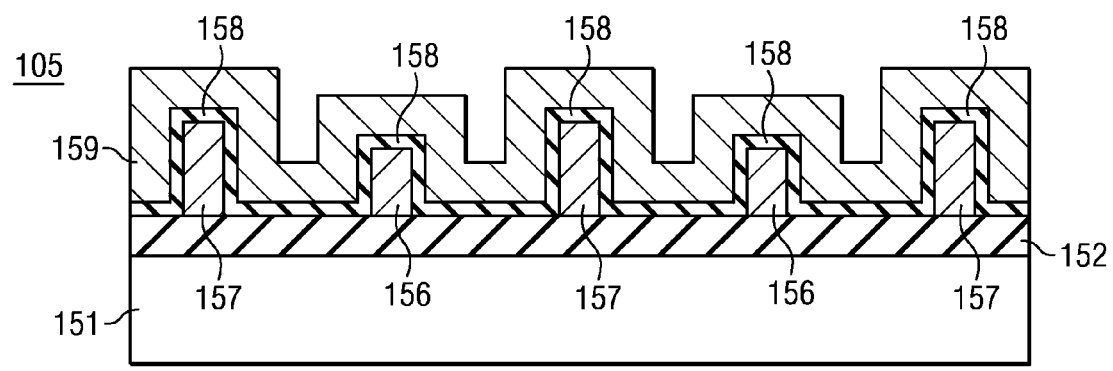

FIG. 1E shows the resulting cross section after step 105 which comprises forming a gate electrode layer 159 on the gate dielectric layer 158 on both the taller fins 157 and the shorter fins 156. The gate electrode layer 159 can comprise polysilicon, for example. In one embodiment, the thickness of the gate electrode layer 159 can be 50 to 200 nm.

Figure 1F:
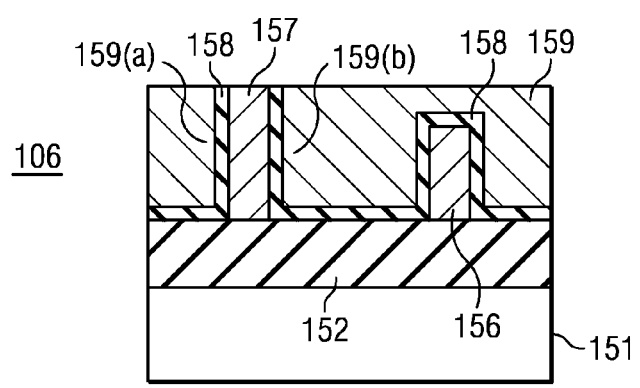

FIG. 1F shows the resulting cross section after step 106 which comprises a planarization process, such as but not limited to chemical-mechanical polishing (CMP) and its variants. Other planarization techniques may also generally be used, such as the resist/etchback planarizing techniques for fabricating semiconductor devices disclosed in U.S. Pat. No. 5,629,224 which is incorporated herein by reference.

The planarization process removes the gate electrode layer 159 from a top of the taller fins 157 and thus the electrical connection between a first gate 159(a) and a second gate 159(b) which are located on the first and second sidewalls of the taller fins 157. This forms the dual gate structure for a split gate FinFET device. The gate electrode layer 159 on a top of the shorter fins 156 remains following CMP to maintain the topside gate electrode layer 159 electrical connection between the gate electrode layer 159 portions on corresponding first and second sidewalls of the shorter fins 156, thus forming the gate structure for a common gate FinFET device. The difference in height between the taller fins 157 (height "h") and the shorter fins 156 (height "h") relative to the thicknesses of the gate dielectric layer 158 and the gate electrode layer 159 is such that planarizing all of the gate electrode layer 158 from the top of the taller fins 157 will leave at least a portion of the gate electrode layer 158 remaining over the top of the shorter fins 156. For the example shown in FIG. 1F, the difference in height is sufficient to also accommodate the full thickness of the gate dielectric layer 157.

Figure 1G:
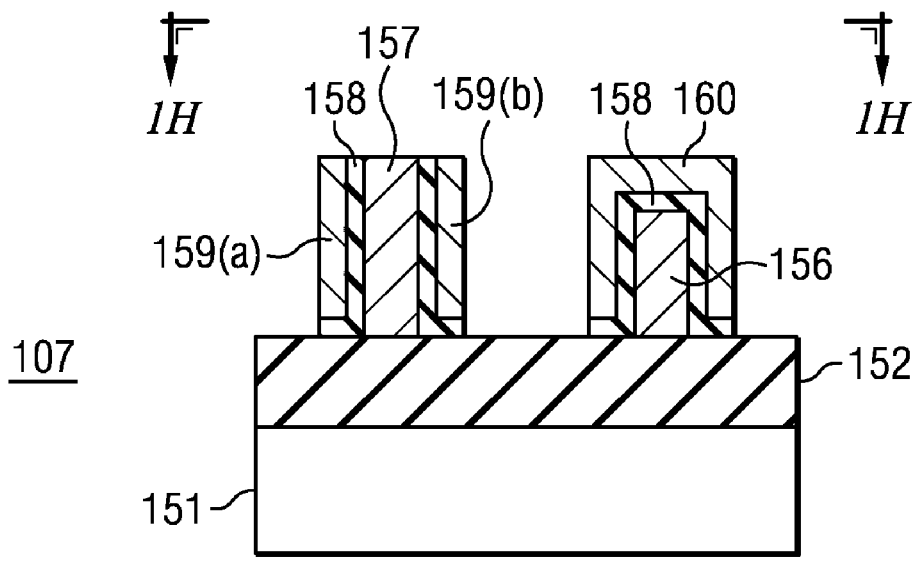
Figure 1H:
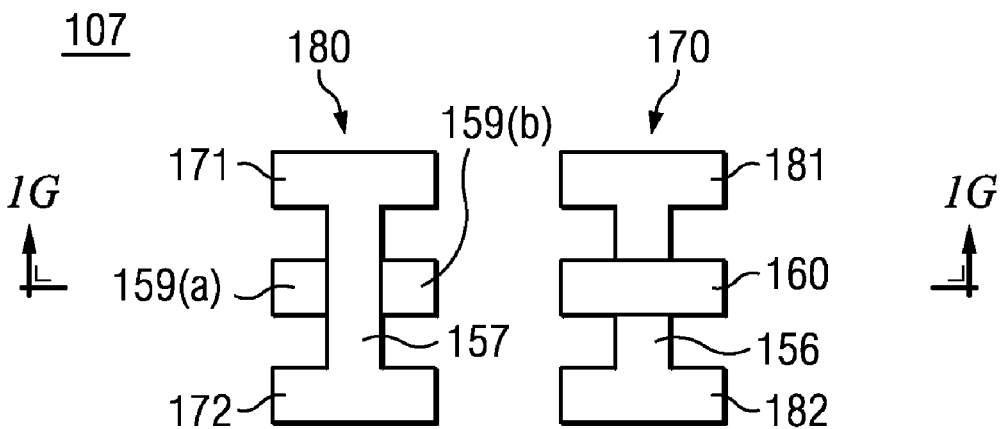

FIG. 1G shows the resulting cross section after step 107 in which the gate electrode layer 159 is patterned to form a patterned gate electrode layer. FIG. 1H is a top view of the structure shown in FIG. 1G. As shown in FIG. 1H, at least one conventional common gate FinFET device 170 comprising a common gate 160, a common source 181 and a common drain 182 is formed from a shorter fin 156 and at least one split gate FinFET device 180 comprising electrically isolated (split) gates 159(a) and 159(b), a common source 171 and a common drain 172 is formed from a taller fin 157. The split gate FinFET device 180 can be seen to generally retain the same area as a common gate FinFET device 170, but provides an extra transistor gate. Fabrication is then completed with additional steps, generally including conventional steps including LDD, spacer, source/drain, and multi-layer metallization processing. In the case of a gate electrode layer 159 comprising polysilicon, the additional steps can include siliciding the gate electrode.

In one embodiment of the invention, replacement gate processing is included. The replacement gate process comprises removing the patterned gate electrode layer, such as a layer comprising polysilicon, associated with at least a portion of the plurality of MOS transistors to form a plurality of trenches, and filling the trenches with a replacement gate electrode layer comprising metal to form replacement metal gate transistors. As known in the art, different metal gate materials (having appropriate work functions) are generally used for PMOS and NMOS devices. Planarization processing generally follows after replacement gate metal deposition.

Figure 2A:
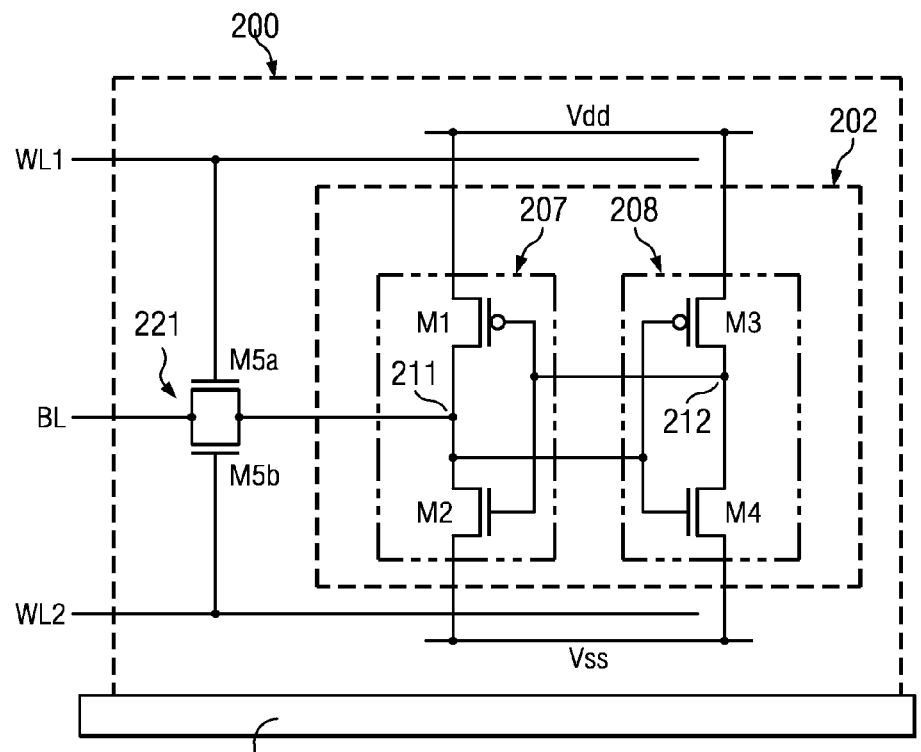
FIG. 2A shows a circuit schematic for a 5T (five-transistor) SRAM cell modified to include a parallel pass gate formed from a split gate FinFET device, according to an embodiment of the invention.

FIG. 2A shows a circuit schematic for a 5T (five-transistor) SRAM cell 200 formed on a substrate 201, modified to include a parallel gate pass gate 221 comprising gates M5a and M5b formed from a split gate FinFET device according to an embodiment of the invention. Cell 200 comprises a core storage element 202 comprising cross-coupled first and second inverters 207, 208 comprising transistors M1, M2 and M3, M4, respectively, having a first storage node 211 and a second complementary storage node 212, and power supply traces Vdd and Vss coupled to the cell 200. The core storage element 202 comprising transistors M1-M4 is shown utilizing conventional single common gate FinFET devices. One of the source or drain of parallel gate pass gate 221 is shown coupled to receive a signal from bitline BL, and the other of the source or drain is coupled to the first storage node 211. A first wordline WL1 is coupled to the first gate M5a and a second wordline WL2 is coupled to the second gate M5b.

Wordlines WL1 and WL2 can be used together or separately. The separate wordlines WL1 and WL2 can both be used for writing, where there is a need to overcome the current cell state. Generally for reading, one of wordlines WL1 and WL2 is used. However, if read speed is important, wordlines WL1 and WL2 may both be used for read.

Signals applied to wordlines WL1 and WL2 can be in a digital form (neither, one or both "on"), or in a digital/analog combination form, where the channel is modulated to optimize the SRAM characteristics. For example, one of the parallel gates can be used as an analog bias, while the other is switched (e.g., digitally). The parallel mode provided by the parallel pass gates M5a and M5b can have one of the split gates used for programming (writing) and the other of the split gates used for reading. This arrangement can provide several potential advantages, such as providing a level of programmability to account for process variability. This arrangement can also provide different read and write pass gate resistances by giving M5a and M5b structural or doping differences.

For example, by selectively implanting one of the channel regions associated with M5a or M5b, the parallel transistors M5a or M5b can be designed to have different strengths, providing added design flexibility. For example, it is possible to selectively dope the channel regions of each side of the common fin, such as with angled implants. This can be used to skew the effect of the respective parallel devices.

Figure 2B:
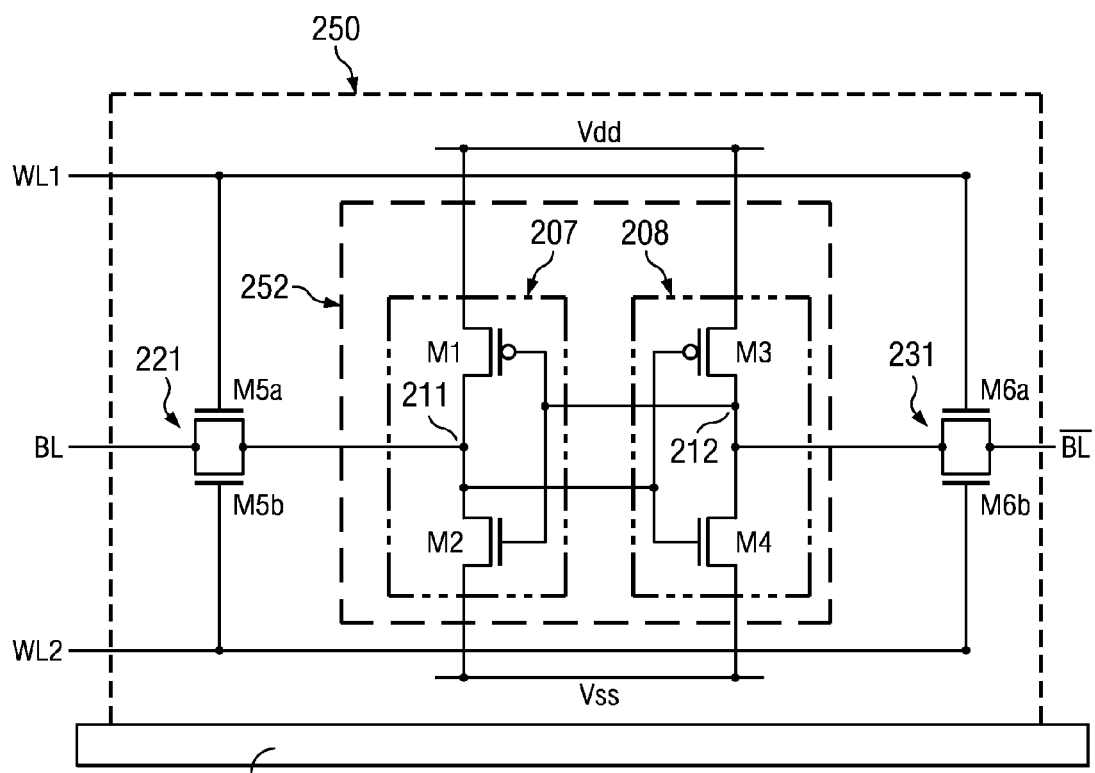
FIG. 2B shows a circuit schematic for a 6T (six-transistor) SRAM cell modified to include a second parallel pass gate formed from another split gate FinFET device, so that parallel pass gates are associated with each of the control nodes, according to an embodiment of the invention.

FIG. 2B shows a circuit schematic for a 6T (six-transistor) SRAM cell 250 modified to include a second parallel pass gate formed from another split gate FinFET device, so that parallel pass gates are associated with each of the control nodes 211 and 212, according to an embodiment of the invention. Cell 250 includes a second pass gate 231 utilizing a second split gate FinFET device, the second pass gate 231 having split gates M6a and M6b and a common source and a drain, wherein the common source or drain of second pass gate 231 is coupled to the second storage node 212. A second complementary bitline (BL-bar) is coupled to the other of the common source or drain of the second pass gate 231. The first wordline (WL1) is shown coupled to gate M6a of second pass gate 231 and the second wordline (WL2) is coupled to gate M6b of second pass gate 231.

Figure 2C:
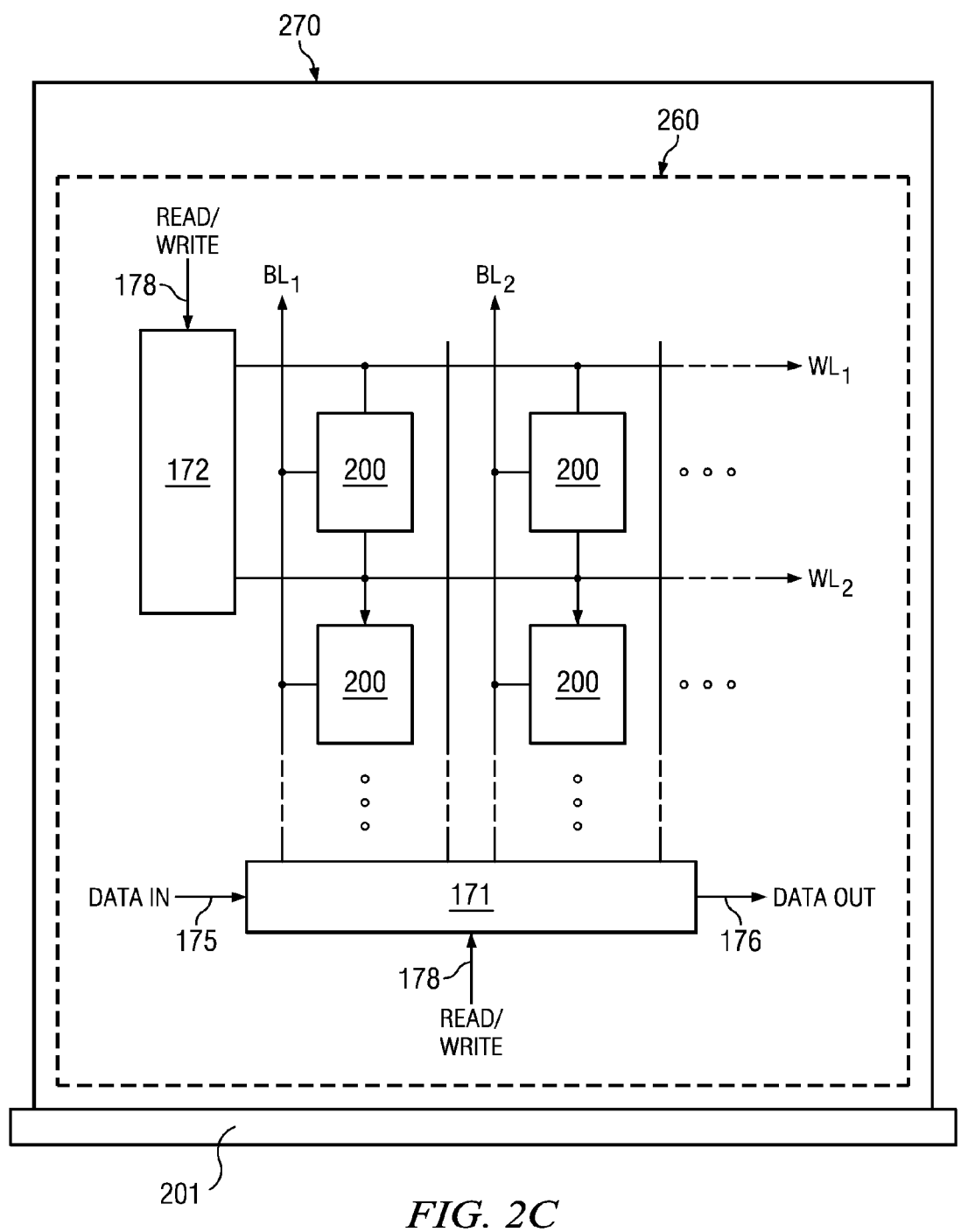
FIG. 2C is a schematic of an integrated circuit comprising a memory array having a plurality of 5T SRAM cells, according to an embodiment of the invention.

FIG. 2C is a schematic of an integrated circuit (IC) 270 formed on a substrate 201 comprising a memory array 260 comprising a plurality of 5T SRAM cells 200, according to an embodiment of the invention. Bitline select controller 171 receives a read/write signal 178 at its input indicating whether a read or write operation is to be performed and the column or bit line address. The bit line select controller 171 also receives a Data In signal 175 in the case of a write operation and provides a Data Out signal 176 in the case of a read operation. An output of the bit line select controller 171 is also coupled to bit lines shown as BL1 and BL2. A writeline select controller 172 receives the read/write signal 178 at its input indicating whether a read or write operation is to be performed. The output of the writeline select controller 172 is coupled to writelines WL1 and WL2.

Figure 3:
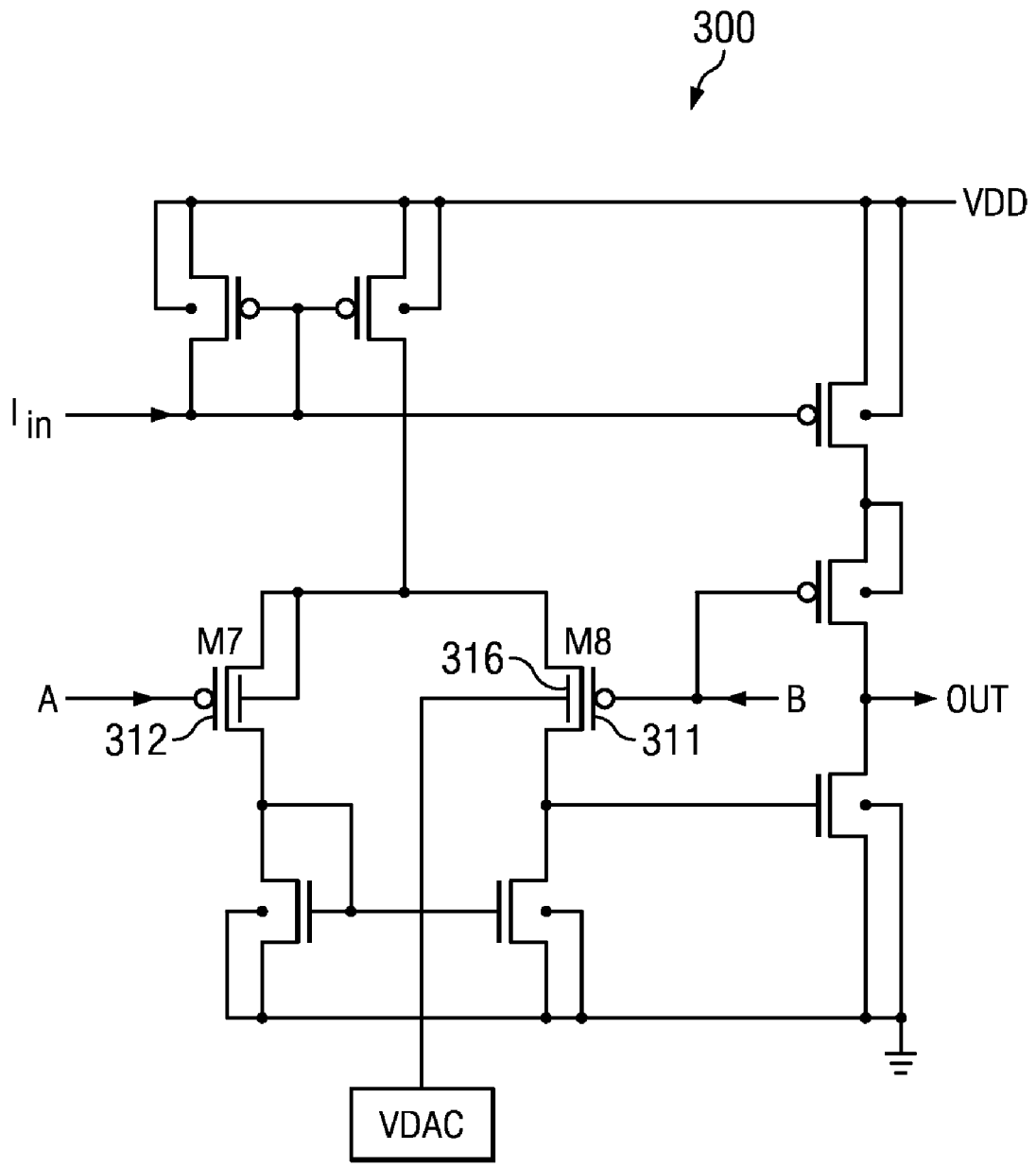
FIG. 3 shows a circuit schematic for an operational amplifier having one of the input differential pair transistors formed from a split gate FinFET device to provide parallel gates, operable to use on back gate bias on one of the parallel gates for mismatch correction, according to another embodiment of the invention.

FIG. 3 shows a circuit schematic for an operational amplifier 300 having an input differential pair comprising transistors M7 and M8, wherein transistor M8 may be formed as a split gate FinFet device to provide back gate bias, according to another embodiment of the invention. The gate of transistor M7 is shown connected to receive an input signal A. Transistor M8 shown with a gate electrode 311 operable to receive an input signal B and a back gate electrode 316 operable to receive a DC bias voltage shown as VDAC, can be provided as a split gate FinFet device having parallel gates M8a, M8b serving in place of gate electrode 311 and back gate electrode 316, respectively. The back gate electrode can be coupled to a back gate bias shown as VDAC, such as for reducing the input offset voltage (VIO) for the differential amplifier, or be used in other circuitry that can benefit from back-gate biasing. Having a back gate connection allows the split gate FinFET device to utilize the "Back-gate bias effect" or "Body effect" to modify threshold voltage. For example, as known in the art, in the case of NMOS transistors, the threshold voltage Vt can be increased for a positive source-to-bulk voltage, wherein the back gate connection can be used to modulate the body voltage.

Other circuits having parallel transistors can also benefit from embodiments of the invention by being able to shrink the associated die area. For example, the PMOS parallel pull-up transistor pair for conventional CMOS NAND gate comprising logic and the NMOS parallel pull-down transistor pair for conventional CMOS NOR gate comprising logic can both be realized using the new split gate FinFET architecture formed from the same fin as described above, with one or more other transistors in the circuit embodiment using conventional common gate FinFETs.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. For example, there can be two series coupling capacitors instead of one. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A method of forming an integrated circuit including a common gate FinFET device and a split gate FinFET device, comprising:
   providing a substrate having a semiconductor surface;
   forming a taller fin and a shorter fin at the semiconductor surface;
   forming a layer of gate electrode material over tops and sides of both the taller fin and the shorter fin;
   planarizing the layer of gate electrode material to break connection of the gate electrode material over the top between sides of the taller fin, leaving connection of the gate electrode material over the top between sides of the shorter fin; and
   patterning the planarized layer of gate electrode material to form a split gate structure on the sides of the taller fin and a common gate structure on the top and sides of the shorter fin.

2. The method of claim 1, further comprising forming a layer of gate dielectric material over tops and sides of both the taller fin and the shorter fin; wherein the layer of gate electrode material is formed over the layer of gate dielectric material.

3. The method of claim 2, wherein planarizing the layer of gate electrode material comprises planarizing both the layer of gate electrode material and the layer of gate dielectric material, down to the top of the taller fin.

4. The method of claim 3, wherein the planarizing comprises chemical-mechanical polishing.

5. The method of claim 4, wherein the layer of gate electrode material comprises polysilicon.

6. The method of claim 5, wherein the substrate is a semiconductor on insulator substrate, wherein the semiconductor surface is a semiconductor surface layer formed on a dielectric layer within the substrate.

7. The method of claim 6, wherein the taller fin and the shorter fin are formed from the semiconductor surface.

8. The method of claim 7, wherein the taller fin and the shorter fin are formed by selectively etching the semiconductor surface.

9. The method of claim 8, wherein the semiconductor surface comprises silicon.

10. The method of claim 9, wherein the integrated circuit comprises an SRAM cell including a pass gate having parallel gates respectively defined by the gate electrode material on the sides of the taller fin.

11. The method of claim 9, wherein the integrated circuit comprises a transistor including gate and back gate structures respectively defined by the gate electrode material on the sides of the taller fin.

12. The method of claim 9, wherein the integrated circuit comprises a transistor pair having transistor gates respectively defined by the gate electrode material on the sides of the taller fin; and further comprising doping the taller fin to provide differently doped channel regions associated with the respective transistor gates.

13. The method of claim 1, wherein a height of the taller fin exceeds a height of the smaller fin by 10%.

14. A method of forming an integrated circuit, comprising:
   providing a substrate having a semiconductor surface;
   forming a plurality of taller fins and a plurality of shorter fins by patterning the semiconductor surface;
   forming a layer of gate dielectric material over tops and sides of both the taller fin and the shorter fin;
   forming a layer of gate electrode material over the layer of gate dielectric material over the tops and sides of both the taller fin and the shorter fin;
   planarizing the layer of gate electrode material to remove the gate electrode material over the top of the taller fin, leaving at least a portion of the gate electrode material over the top between the sides of the shorter fin; and
   patterning the planarized layer of gate electrode material to form a split gate structure on the sides of the taller fin and a common gate structure on the top and sides of the shorter fin.

15. The method of claim 14, wherein planarizing the layer of gate electrode material comprises planarizing both the layer of gate electrode material and the layer of gate dielectric material, thereby removing both the gate electrode material and at least some of the gate dielectric material over the top of the taller fin and leaving at least a portion of the gate electrode material and all of the gate dielectric material over the top of the shorter fin.

16. The method of claim 15, wherein the planarizing comprises chemical-mechanical polishing.

17. A method of forming an integrated circuit, comprising:
   providing a substrate having a silicon surface over an insulating layer;
   forming a plurality of taller fins and a plurality of shorter fins by selectively etching the silicon surface;
   forming a layer of gate dielectric material over tops and sides of both the taller fin and the shorter fin;
   forming a layer of gate electrode material comprising polysilicon over the layer of gate dielectric material over the tops and sides of both the taller fin and the shorter fin;
   using chemical-mechanical polishing, planarizing the layer of gate electrode material to remove the gate electrode material over the top of the taller fin, leaving at least a portion of the gate electrode material over the top between the sides of the shorter fin; and
   selectively etching the planarized layer of gate electrode material to form gate structure on the sides of the taller fin and on the top and sides of the shorter fin.

18. The method of claim 17, wherein planarizing the layer of gate electrode material comprises planarizing both the layer of gate electrode material and the layer of gate dielectric material, thereby removing both the gate electrode material and at least some of the gate dielectric material over the top of the taller fin and leaving at least a portion of the gate electrode material and all of the gate dielectric material over the top of the shorter fin.

* * * * *